United States Patent
Wei et al.

(10) Patent No.: US 7,131,088 B2
(45) Date of Patent: Oct. 31, 2006

(54) RELIABILITY BASED CHARACTERIZATION USING BISECTION

(75) Inventors: You-Pang Wei, Los Altos, CA (US);
Yuhung Liao, Sunnyvale, CA (US);
Mingchi Liu, Santa Clara, CA (US);
YuJiao Ping, Santa Clara, CA (US)

(73) Assignee: Legend Design Technology, Inc., Santa Clara, CA (US)

(*) Notice: Subject to any disclaimer, the term of this patent is extended or adjusted under 35 U.S.C. 154(b) by 363 days.

(21) Appl. No.: 10/729,697

(22) Filed: Dec. 5, 2003

(65) Prior Publication Data

US 2005/0050498 A1  Mar. 3, 2005

Related U.S. Application Data

(60) Provisional application No. 60/497,972, filed on Aug. 25, 2003.

(51) Int. Cl.
*G06F 17/50* (2006.01)
*G06F 9/45* (2006.01)

(52) U.S. Cl. .......................... 716/6; 703/19
(58) Field of Classification Search .......... 716/5, 716/6; 703/19
See application file for complete search history.

(56) References Cited

U.S. PATENT DOCUMENTS

| 6,112,022 | A | 8/2000 | Wei | |
|---|---|---|---|---|
| 6,249,901 | B1 | 6/2001 | Yuan et al. | |
| 6,289,412 | B1 | 9/2001 | Yuan et al. | |
| 6,732,066 | B1* | 5/2004 | Krishnamoorthy | 703/14 |
| 6,745,376 | B1* | 6/2004 | Fredrickson | 716/6 |
| 6,854,102 | B1* | 2/2005 | Maheshwari | 716/6 |
| 6,934,922 | B1* | 8/2005 | Burnley | 716/6 |
| 6,990,646 | B1* | 1/2006 | Yoshikawa | 716/6 |
| 2003/0093763 | A1* | 5/2003 | McConaghy | 716/2 |

* cited by examiner

*Primary Examiner*—Stacy A. Whitmore
*Assistant Examiner*—Magid Y. Dimyan
(74) *Attorney, Agent, or Firm*—Buchanan, Ingersoll & Rooney, LLP

(57) ABSTRACT

In accordance with the present invention there is provided a method for determining an optimized parameter for a circuit simulation. A circuit path for the simulation is determined, and maximum and minimum optimization parameters are decided. Next, the circuit path is simulated using the maximum optimization parameter. The circuit path is simulated using the minimum optimization parameter and a primary criteria parameter is also calculated. The simulations are compared to determine whether the same status (both succeed or both fail) is generated for both the minimum optimization parameter and the maximum optimization parameter. If the simulations do not indicate the same status, then the optimization parameter is recalculated and the circuit is simulated until the primary criteria parameter converges to a prescribed value.

15 Claims, 2 Drawing Sheets

RELIABILITY BASED CHARACTERIZATION USING BISECTION

RELATED APPLICATIONS

The present application claims the benefit of U.S. Provisional Application No. 60/497,972 entitled "RELIABILITY BASED CHARACTERIZATION SYSTEM IN IC/SoS DESIGNS" filed Aug. 25, 2003, the entire contents of which are incorporated herein by reference.

FIELD OF INVENTION

The present invention generally relates to computer aided methods and tools for designing, simulating, characterizing and verifying integrated circuit (IC) designs, and more particularly to a system and method for verifying and characterizing the noise margin of signals within such designs.

BACKGROUND OF THE INVENTION

The design of very large-scale integrated (VLSI) circuits using computer aided design (CAD) systems is a very time consuming and computationally intensive process. As the complexity of VLSI circuit design has increased, circuit designers have begun incorporating basic circuit building blocks into circuit designs so that the designers do not need to start from scratch for each design. This design approach is commonly referred to as an intellectual property (IP) based design approach and the basic circuit building blocks are referred to as IP blocks.

In accordance with system on chip (SOC) technology, a variety of circuit building blocks are incorporated onto a single integrated chip. Each of the building blocks performs a specific function of an electronic system. The IP building blocks include, but are not limited to, embedded memory, standard cell, I/O devices, analog and system interfaces, etc.

. . .

A timing model including many characterized timing parameters for each IP block that is to be incorporated into a system chip is required by the IC designers. Important timing parameters include setup time, hold time, access time, minimum pulse high and low time, and other I/O pin characteristics. Designers are interested in characterizing and optimizing timing characteristics associated with an IP block design.

There are two methods of IP block characterization and verification. The first method is based on 'full circuit' simulations. For deep submicron designs, a netlist size of layout-extracted IP blocks could be enormous with a large number of resistors and capacitors. It might be prohibitive to run numerous full circuit simulations with a high-accuracy circuit simulator. The other method is a characterization based on 'critical-path circuit' simulations. Instead of using a full circuit, a small detailed critical circuit including multiple critical paths is used of simulation. The 'critical-path circuits' are built either manually or by software tools for automation, accuracy and performance.

The simulation results observed during the characterization process are only at the pins of the full circuit or at ports of the 'critical-path circuit'. Reliability issues such as noise margin, glitch, and racing conditions that occur inside the circuit are normally ignored. Accordingly, the timing parameters generated by the simulation may be too optimistic and incorrect.

Furthermore, the circuit or subcircuit block is viewed as a black-box when the circuit simulation is performed. However, the simulations results observed at the pins cannot detect the above-mentioned reliability issues that can occur inside the circuit. The models based upon simulation and characterization results could be incorrect thereby causing yield and reliability problems.

SUMMARY OF THE INVENTION

In accordance with the present invention there is provided a method for determining an optimized parameter for a circuit simulation. A circuit path for the simulation is determined, and maximum and minimum optimization parameters are decided. Next, the circuit path is simulated using the maximum optimization parameter. The circuit path is simulated using the minimum optimization parameter and a primary criteria parameter is also calculated from the simulations. The simulations are compared to determine whether the same status (both succeed or both fail) is generated. If the simulations do not indicate the same status, then the optimization parameter is recalculated and the circuit is simulated until the primary criteria parameter converges to a prescribed value.

The optimization parameter is a setup and hold time for the circuit and the primary criteria parameter is a bisection error of the simulation. In accordance with the present invention, further reliability checks can be performed on the circuit after determining whether the simulations indicate the same status (both succeed or both fail). Typically, the optimization parameter is recalculated by averaging the initial minimum and maximum optimization parameters. In this regard, the recalculated optimization parameter is used to recalculate the primary criteria parameter to determine convergence. If the primary criteria parameter does not converge, then the current optimization parameter is set to the current maximum optimization parameter value for the circuit simulation when the current optimization value and the current minimum optimization parameter do not have the same status (both succeed or both fail). Alternatively, if the primary criteria parameter does not converge and the current optimization value and the current minimum optimization parameter do have the same status (both succeed or both fail), then the current optimization parameter is set to the current minimum optimization parameter value for the circuit simulation.

BRIEF DESCRIPTION OF THE DRAWINGS

These, as well as other features of the present invention, will become more apparent upon reference to the drawings wherein.

DETAILED DESCRIPTION

Various aspects will now be described in connection with exemplary embodiments, including certain aspects described in terms of sequences of actions that can be performed by elements of a computer system. For example, it will be recognized that in each of the embodiments, the various actions can be performed by specialized circuits or circuitry (e.g., discrete and/or integrated logic gates interconnected to perform a specialized function), by program instructions being executed by one or more processors, or by a combination of both. Thus, the various aspects can be embodied in many different forms, and all such forms are contemplated to be within the scope of what is described. The instructions of a computer program as illustrated in FIGS. 1a–1b for characterizing a circuit can be embodied in any computer readable medium for use by or in connection with an instruction execution system, apparatus, or device, such as a computer based system, processor containing system, or other system that can fetch the instructions from the instruction execution system, apparatus, or device and execute the instructions.

As used here, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non exhaustive list) of the computer readable-medium can include the following: an electrical connection having one or more wires, a portable computer diskette, a random access memory (RAM), a read only memory (ROM), an erasable programmable read only memory (EPROM or Flash memory), an optical fiber, and a portable compact disc read only memory (CDROM).

The present invention generally relates to Applicants' co-pending patent applications: U.S. patent application Ser. No. 10/729,596, entitled "TIMING SOFT ERROR CHECK", U.S. patent application No. 10/729,785, entitled "GLITCH AND METASTABILITY CHECKS USING SIGNAL CHARACTERISTICS", and U.S. patent application Ser. No. 10/729,701, entitled "VERIFICATION AND CHARACTERIZATION OF NOISE MARGIN IN INTEGRATED CIRCUIT DESIGNS", filed concurrently herewith and the entire contents of each application are incorporated herein by reference.

Figure 1A:
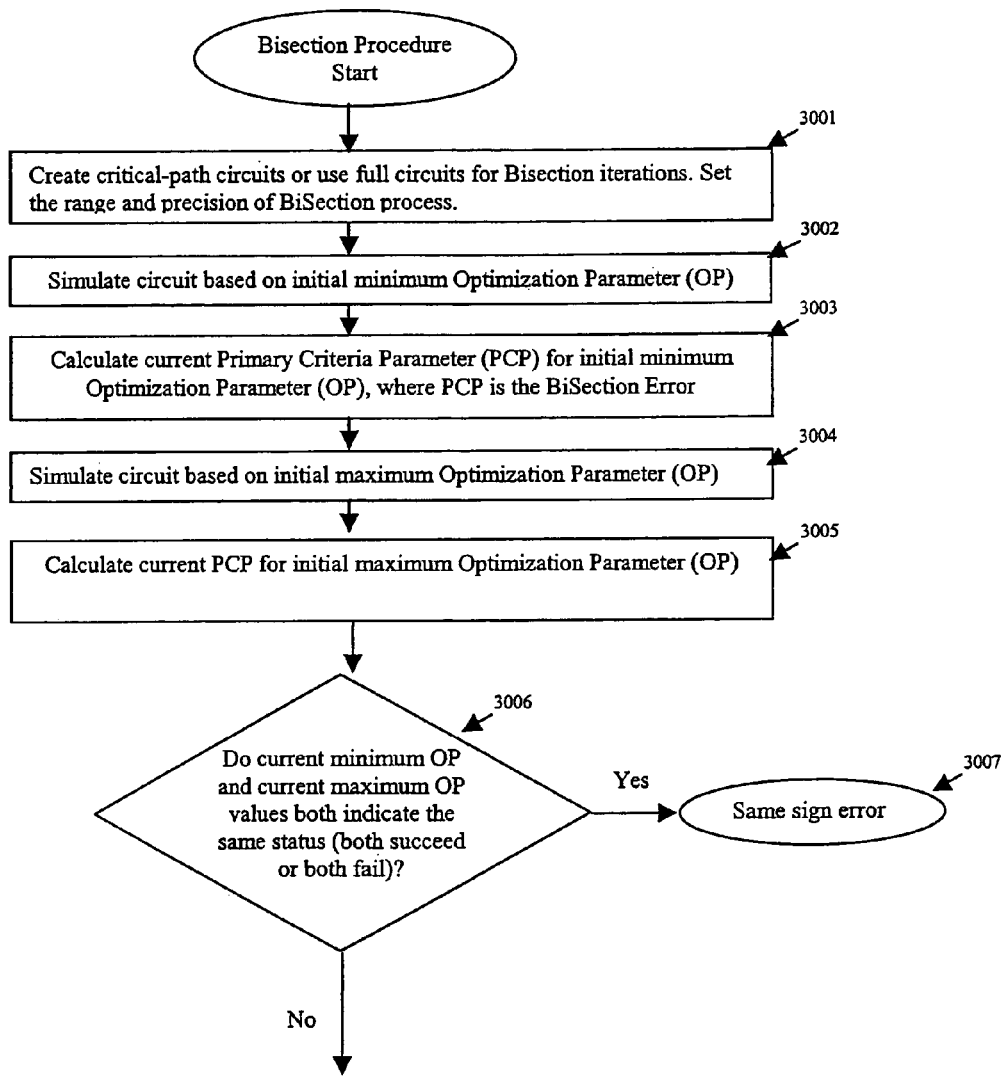
FIGS. 1a–1b show a flowchart illustrating how to determine an optimized parameter for a circuit simulation.
Figure 1B:
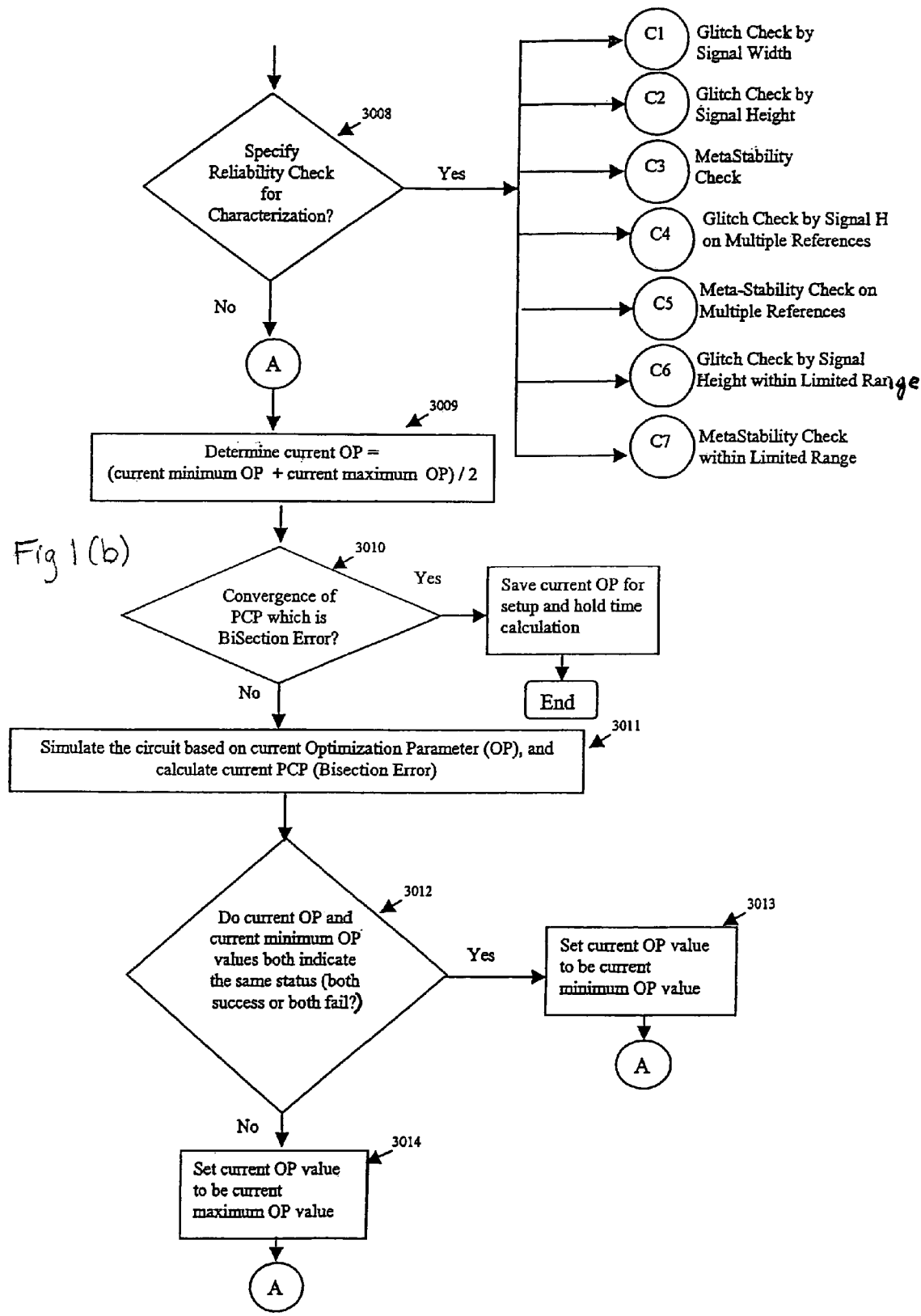

Referring now to the drawings wherein the showings are for purposes of illustrating preferred embodiments of the present invention only, and not for purposes of limiting the same, FIGS. 1a–1b show a flowchart illustrating a method of determining an optimized parameter for a circuit simulation. In step 3001, critical-path circuits of full circuits for the circuit simulations are determined for the bisection procedure. The range and precision of the bisection procedure and clock cycle timing need to be decided. In step 3002, the circuit is simulated based upon an initial optimization parameter (OP). For the reliability based characterization illustrated in FIGS. 1a–1b, the OP is the setup time or hold time for the circuit. The initial minimum and maximum OP's are determined by user specified information. In step 3003, the primary criteria parameter (PCP) is calculated for the initial minimum OP. The PCP is the bisection error for the setup time or hold time. Once the POP is calculated, then the circuit is simulated in step 3004 for the initial maximum optimization parameter (OP). In step 3005, the current POP is then calculated for the initial maximum OP.

In step 3006, the current minimum OP and the current maximum OP are compared to determine if they both fail or succeed. Specifically, if both the current maximum OP and the current minimum OP both indicate the same status (both succeed or both fail), then the process proceeds to step 3007 where the process ends because of a same sign error. However, if both the current minimum OP and the current maximum OP do not indicate the same status, then the process proceeds to step 3008 where other reliability checks on the circuit may be performed. Specifically, the user has the option of performing glitch and metastability checks C1–C7 as described in applicant's co-pending patent application No. 10/729,785, entitled "GLITCH AND METASTABILITY CHECKS USING SIGNAL CHARACTERISTICS", the contents of which are incorporated herein by reference.

If the user decides not to perform other reliability checks in step 3008, then the process proceeds to step 3009 where the current OP is calculated. Specifically, the current OP is calculated by averaging the current minimum OP and the current maximum OP. After the current OP has been calculated, then the PCP is checked for convergence in step 3010. Specifically, the convergence is determined by whether the bisection error (i.e., PCP) has converged into a bisection precision range which is specified by the user. If the bisection error has converged, then the current OP is saved as the setup and hold time for any subsequent calculations. However, if there is not convergence of the bisection error, then the circuit is simulated again in step 3011 using the current OP calculated in step 3009.

Once the circuit simulation has been performed, the process proceeds to step 3012 wherein the current OP and the current minimum OP are compared. If both values indicate the same status (i.e., both success or both fail), then the process proceeds to step 3013 wherein the current OP value is set to be the current minimum OP value. Furthermore, the process proceeds to point "A" where in step 3009, the current OP is calculated until convergence occurs.

However, if in step 3012, the current OP and the current minimum OP values do not indicate the same status, then the process proceeds to step 3014 wherein the current OP is set to be the maximum OP value. Then the process returns to point "A" and step 3009 where the process continues until the bisection error converges. In this respect, the process iteratively repeats to find the optimized setup and hold time.

It will be appreciated by those of ordinary skill in the art that the concepts and techniques described here can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A method of determining an optimized parameter for a circuit simulation, the method comprising the steps:

determining a path of the circuit to analyze;

setting an initial maximum and minimum optimization parameter;

simulating the circuit with the initial minimum optimization parameter;

calculating a current primary criteria parameter from the circuit simulation with the initial minimum optimization parameter;

simulating the circuit with the initial maximum optimization parameter;

determining whether the simulations with the initial maximum and minimum optimization parameters generate the same status; and if the simulations do not indicate the same status, continuing to recalculate the optimization parameter and simulating the circuit until the primary criteria parameter converges to a prescribed value.

2. The method of claim 1 wherein the optimization parameter is a setup and hold time for the circuit and the current primary criteria parameter is a bisection error of the simulation.

3. The method of claim 2 further comprising the step of determining further reliability checks on the circuit after determining whether the simulations indicate the same status.

4. The method of claim 2 wherein the optimization parameter is recalculated by averaging the initial minimum and maximum optimization parameters.

5. The method of claim 4 wherein the circuit is simulated using the recalculated optimization parameter and the primary criteria parameter is recalculated to determine convergence.

6. The method of claim 5 wherein if the primary criteria parameter does not converge, then the current optimization parameter is set to the current maximum optimization parameter value for the circuit simulation when the current optimization value and the current minimum optimization parameter do not have the same status.

7. The method of claim 5 wherein if the primary criteria parameter does not converge, then the current optimization parameter is set to the current minimum optimization parameter value for the circuit simulation when the current optimization value and the current minimum optimization parameter do have the same status.

8. A system for determining an optimized parameter for a circuit simulation, the system comprising:
   a computer configured to execute the following procedure:
      determine a path of the circuit to analyze;
      set an initial maximum and minimum optimization parameter;
      simulate the circuit with the initial minimum optimization parameter;
      calculate a current primary criteria parameter from the circuit simulation with the initial minimum optimization parameter;
   simulate the circuit with the initial maximum optimization parameter;
   determine whether the simulations with the initial maximum and minimum optimization parameters generate the same status; and
   if the simulations do not generate the same status, continue to recalculate the optimization parameter and simulate the circuit until the primary criteria parameter converges to a prescribed value.

9. The system of claim 8 wherein the optimization parameter is a setup and hold time for the circuit and the current primary criteria parameter is a bisection error of the simulation.

10. The system of claim 8 wherein the computer is configured to perform further reliability checks on the circuit after determining whether the simulations generate the same status.

11. The system of claim 8 wherein the computer is configured to determine whether to perform further reliability checks on the circuit based on a user assigned algorithm.

12. The system of claim 9 wherein the optimization parameter is recalculated by averaging the initial minimum and maximum optimization parameters.

13. The system of claim 12 wherein the circuit is simulated using the recalculated optimization parameter and the primary criteria parameter is recalculated to determine convergence.

14. The system of claim 13 wherein if the primary criteria parameter does not converge, then the current optimization parameter is set to the current maximum optimization parameter value for the circuit simulation when the current optimization value and the current minimum optimization parameter do not have the same status.

15. The system of claim 13 wherein if the primary criteria parameter does not converge, then the current optimization parameter is set to the current minimum optimization parameter value for the circuit simulation when the current optimization value and the current minimum optimization parameter do have the same status.

* * * * *